United States Patent
Hayashi

(10) Patent No.: US 9,240,337 B2
(45) Date of Patent: Jan. 19, 2016

(54) SUBSTRATE TRANSPORT METHOD, SUBSTRATE TRANSPORT APPARATUS, AND COATING AND DEVELOPING SYSTEM

(75) Inventor: Tokutarou Hayashi, Koshi-Shi (JP)

(73) Assignee: Tokyo Electron Limited, Minato-Ku (JP)

( * ) Notice: Subject to any disclaimer, the term of this patent is extended or adjusted under 35 U.S.C. 154(b) by 928 days.

(21) Appl. No.: 13/442,123

(22) Filed: Apr. 9, 2012

(65) Prior Publication Data

US 2012/0257176 A1   Oct. 11, 2012

(30) Foreign Application Priority Data

Apr. 11, 2011 (JP) .................................. 2011-087302

(51) Int. Cl.
| | |
|---|---|
| G06F 7/00 | (2006.01) |
| G06F 19/00 | (2011.01) |
| H01L 21/67 | (2006.01) |
| H01L 21/677 | (2006.01) |
| H01L 21/68 | (2006.01) |
| G03F 7/16 | (2006.01) |
| G03F 7/30 | (2006.01) |

(52) U.S. Cl.
CPC .......... *H01L 21/67259* (2013.01); *G03F 7/162* (2013.01); *G03F 7/3021* (2013.01); *H01L 21/67742* (2013.01); *H01L 21/67748* (2013.01); *H01L 21/681* (2013.01)

(58) Field of Classification Search
None
See application file for complete search history.

(56) References Cited

U.S. PATENT DOCUMENTS

| 2009/0053023 A1* | 2/2009 | Wakabayashi | ........ H01L 21/681 414/222.13 |
| 2010/0008688 A1* | 1/2010 | Kimura | ................... H01L 21/68 399/66 |

FOREIGN PATENT DOCUMENTS

| JP | 08-031905 A1 | 2/1996 |
| JP | 2006-351884 A1 | 12/2006 |
| JP | 2006351884 A | * 12/2006 |

\* cited by examiner

*Primary Examiner* — Yolanda Cumbess
(74) *Attorney, Agent, or Firm* — Burr & Brown, PLLC

(57) ABSTRACT

A substrate transporting method includes: after a holding unit of a substrate holding apparatus receives a substrate from one placement location for a substrate and holds it, detecting a first positional deviation of the substrate from a reference position of the substrate on the holding unit; transporting the substrate held by the holding unit to a position facing another placement location; detecting a second positional deviation of the substrate from the reference position of the substrate on the holding unit, when the substrate is located at the position facing the another placement location; calculating, based on the first and second positional deviations, a positional displacement of the substrate relative to the holding unit that occurred during the transporting of the substrate to the position facing the another placement location; and determining whether or not the positional displacement thus calculated falls within a predetermined range.

13 Claims, 14 Drawing Sheets

SUBSTRATE TRANSPORT METHOD, SUBSTRATE TRANSPORT APPARATUS, AND COATING AND DEVELOPING SYSTEM

CROSS-REFERENCE TO RELATED APPLICATION

This application is based on and claims the benefit of priorities from Japanese Patent Application No. 2011-087302 filed on Apr. 11, 2011, the entire contents of which are incorporated herein by reference.

BACKGROUND OF THE INVENTION

1. Field of the Invention

The present disclosure relates to a substrate transport method, a substrate transport apparatus, and a coating and developing system including the substrate transport apparatus.

2. Description of Related Art

In the manufacturing process of semiconductor devices or flat panel displays (FPD), a substrate is sequentially transported to a plurality of processing modules by a substrate transport apparatus, where the substrate is subjected to predetermined processes. The substrate transport apparatus includes, for example, a fork for holding the substrate and a base that supports the fork rotatable and movable back and forth.

There are cases where the fork is provided with a vacuum mechanism in order to firmly hold the substrate. Specifically, the fork has a pipe formed inside the fork and opens at the end portion of the fork, suction ports (e.g., three suction ports) communicating with the pipe and opening at the surface of the fork, and pads made of an elastic material or another material disposed to surround each of the suction ports so as to improve the adhesion between the fork and the back surface of the substrate. The pipe is connected to a suction device. With such configuration, when a substrate is mounted on the pads on the surface of the fork, the substrate is pushed toward the pads by suction, whereby it is firmly held by the fork.

However, since the pads contact with the back surface of the substrate, abrasion of the pads may occur. When the pads are abraded, the substrate may shift from the pads during its transportation by the fork, possibly resulting in the substrate to be not appropriately placed on a substrate placement location. Although the abrasion of the pads can be visually inspected during, for example, regular maintenance, it is difficult to quantitatively determine the degree of abrasion. The operated substrate processing system may be driven to stop due to the positional displacement (shift) of the substrate during its transportation.

The factor of the substrate shift is not only abrasion of pads: it may as well be shifted from the pads for reasons such as warpage of the substrate, leakage in the pipe between the suction device and the pads, and reduction in suction force due to a failure in the suction device. These troubles may also cause the substrate to be not appropriately placed on the substrate placement location.

As an example of techniques for correcting deviation in the setting position of a substrate, JP8-031905A and JP2006-351884A disclose such techniques.

SUMMARY OF THE INVENTION

Embodiments disclosed herein enable detection of positional deviation of a substrate caused by vacuum mechanism failure in a substrate transport apparatus.

In one embodiment, there is provided a substrate transport method that is performed in a substrate processing system, the substrate processing system including a substrate transport apparatus, which has a holding unit configured to hold the substrate by vacuum suction and which is configured to transport the substrate held by the holding unit, the substrate processing system further including a plurality of placement locations each allowing the substrate transported by the substrate transport apparatus to be placed thereon, the method including: receiving the substrate placed on one of the plurality of placement locations by the holding unit and holding the substrate by vacuum suction; retracting the holding unit from the one placement location with the holding unit holding the substrate; detecting a first positional deviation of the substrate from a reference position of the substrate on the holding unit; transporting the substrate held by the holding unit to a position facing another placement location; detecting a second positional deviation of the substrate from the reference position of the substrate on the holding unit, when the substrate is located at the position facing said another placement location; calculating, based on the first and second positional deviations, a positional displacement of the substrate relative to the holding unit that occurred during the transporting of the substrate to the position facing the another placement location; and determining whether or not the positional displacement thus calculated falls within a predetermined range. The "placement location" may be provided by a stage on which a wafer is placed, or a chuck by which a wafer is held, for example.

In another embodiment, there is provided a substrate transport apparatus that transports a substrate between a plurality of placement locations each allowing the substrate to be placed thereon, the substrate transport apparatus including: a holding unit that holds a substrate by vacuum suction; a detector that detects a positional deviation of the substrate held by the holding unit from a reference position of the substrate on the holding unit; and a controller that calculates a positional displacement of the substrate relative to the holding unit that has occurred during transportation, and determines whether or not positional displacement is in a predetermined range, wherein the controller is configured to calculate the positional displacement based on a first positional deviation of the substrate detected by the detector after the holding unit has held the substrate received from one of the plurality of placement locations, and a second positional deviation of the substrate detected by the detector at a position facing another placement location after the holding unit has been moved to the position facing said another placement location.

DETAILED DESCRIPTION OF THE INVENTION

Figure 1:
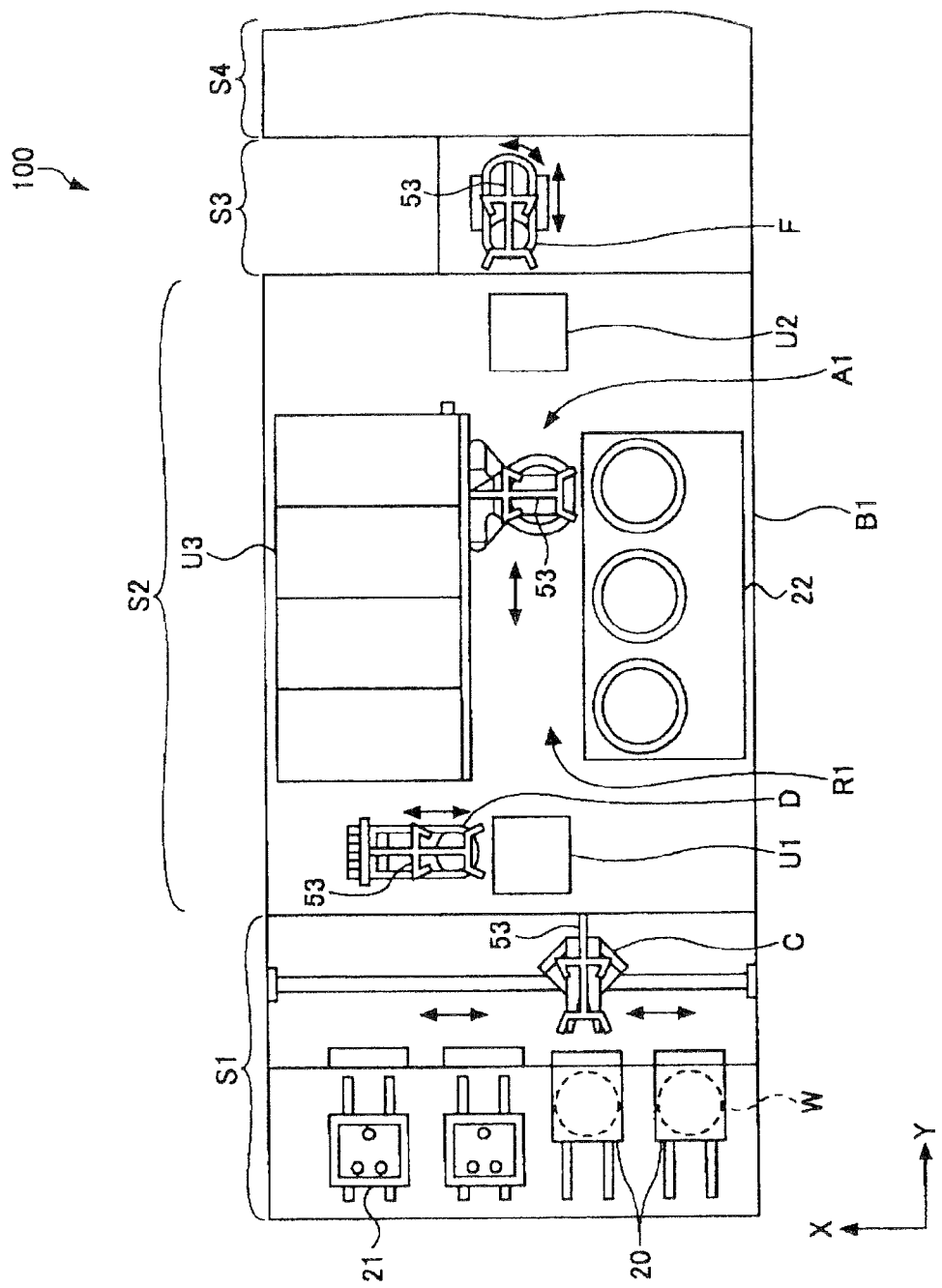
FIG. 1 is a plan view showing the configuration of a photoresist coating and developing system in one embodiment.

Embodiments are described below with reference to the accompanying drawings. The same or corresponding members or parts are indicated by the same or corresponding reference numerals in the accompanying drawings, and repeated descriptions thereof are omitted.

Figure 2:
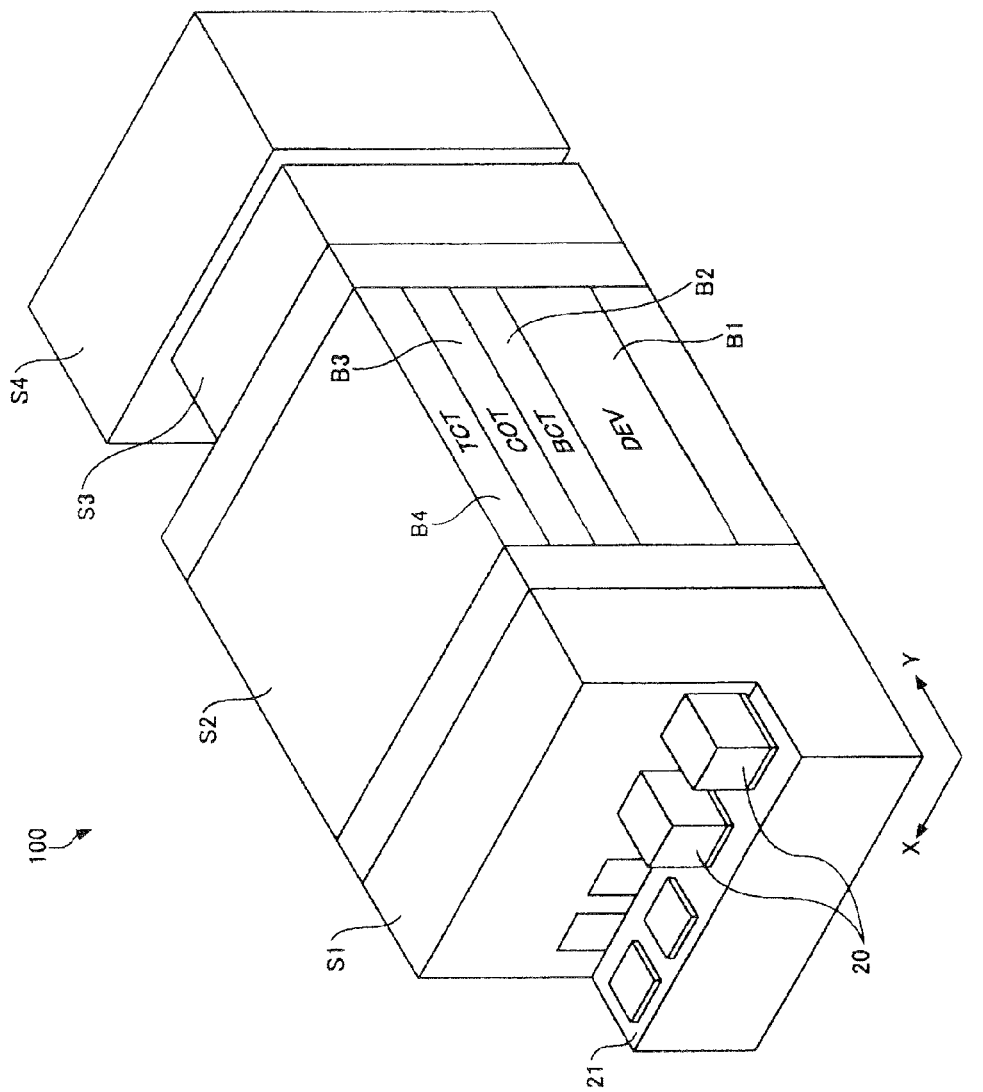
FIG. 2 is a schematic perspective view showing the configuration of the photoresist coating and developing system.

First, a photoresist coating and developing system (hereinafter referred to as coating and developing system) in one embodiment is described with reference to FIGS. 1 to 4. As illustrated in FIGS. 1 and 2, the coating and developing system 100 has a carrier station S1, a processing station S2, and an interface station S3 arranged in that order. In addition, an exposure device S4 is connected to the interface station S3 side of the coating and developing system 100.

The carrier station S1 includes a mount table 21 and a transport mechanism C. A carrier 20 that stores a certain number of semiconductor wafers W (hereinafter referred to as wafers W), e.g., 25 wafers W, is mounted on the mount table 21. Four carriers 20 can be arranged in a row in this embodiment. Hereafter, as illustrated in FIG. 1, the direction in which the carriers 20 are arranged is defined as the X direction, and the direction perpendicular to the X direction is defined as the Y direction. The transport mechanism C receives a wafer W from a carrier 20 and transports the wafer W to the processing station S2, and as well receives a wafer W processed in the processing station S2 and stores the wafer W into a carrier 20.

As illustrated in FIGS. 1 and 2, the processing station S2 is connected to the carrier station S1 on the +Y direction side. The processing station S2 has a rack unit U1, a rack unit U2, a first block (DEV layer) B1, a second block (BCT layer) B2, a third block (COT layer) B3, and a fourth block (TCT layer) B4.

Figure 3:
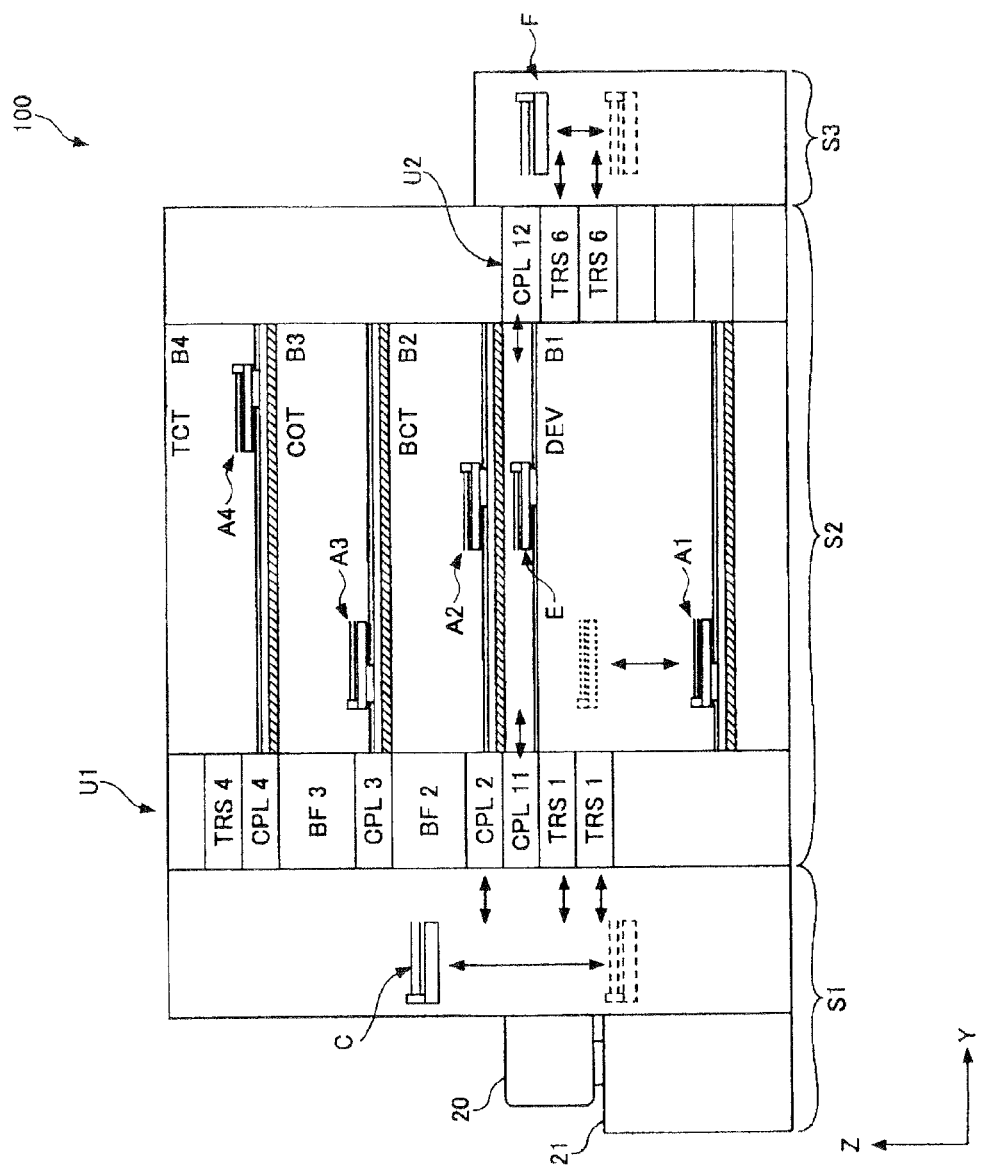
FIG. 3 is a side view of the configuration of the photoresist coating and developing system.

As illustrated in FIG. 3, the rack unit U1 has, for example, receiving/delivering modules TRS1, TRS1, CPL11, CPL2, BF2, CPL3, BF3, CPL4, and TRS4 stacked in order from the bottom. As illustrated in FIG. 1, a transport mechanism D that is vertically movable is disposed on the +X direction side of the rack unit U1. The transport mechanism D transports a wafer W among the modules of the rack unit U1. As illustrated in FIG. 3, the rack unit U2 has, for example, receiving/delivering modules TRS6, TRS6, and CPL12 stacked in order from the bottom.

The receiving/delivering modules indicated by "CPL+ number" include those that double as a heating module for heating the wafer W and those that double as a cooling module for cooling the wafer W to maintain its temperature at a predetermined temperature (e.g., 23° C.). The receiving/delivering modules indicated by "BF+number" double as a buffer module that can hold a plurality of wafers W. In addition, the receiving/delivering modules TRS, CPL, BF, etc. each has a placement location on which a wafer W is placed.

As illustrated in FIGS. 1 and 3, the first block B1 includes development modules 22, a transport arm A1, and a shuttle arm E. To be more specific, there are two developing modules 22 stacked in the vertical direction in the first block B1. Although not illustrated, the developing modules 22 each has a chuck (placement location) for holding and rotating the wafer W, a chemical solution supply nozzle for supplying chemical solution to the wafer W held by the chuck, and a cup surrounding the wafer W held by the chuck. A developer as the chemical solution is supplied to an exposed photoresist film formed on the surface of the wafer W to thereby develop the photoresist film. The transport arm A1 transports wafers W to the two developing modules 22. The shuttle arm E transports the wafer W between the receiving/delivering module CPL 11 of the rack unit U1 and the receiving/delivering module CPL 12 of the rack unit U2.

Figure 4:
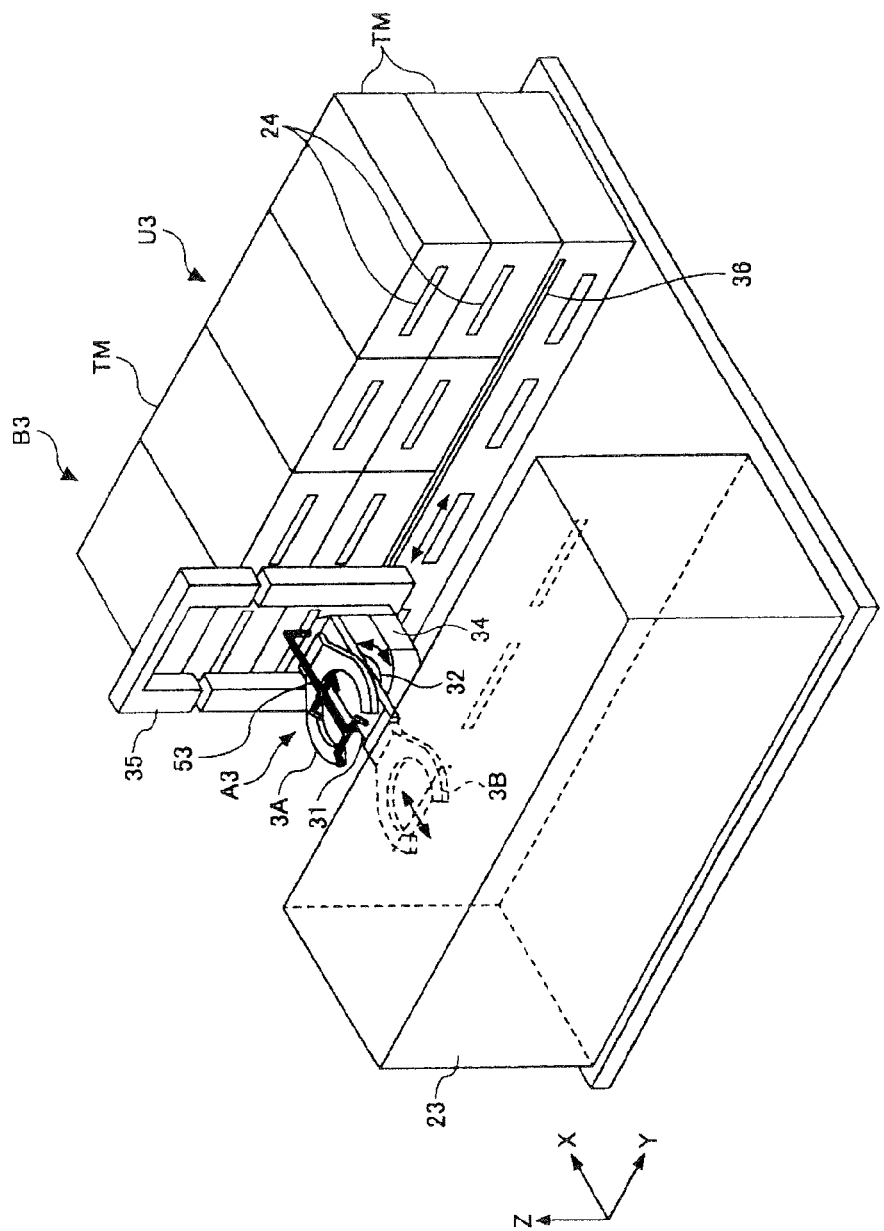
FIG. 4 is a perspective view of showing the configuration of a third block of the photoresist coating and developing system.

Referring to FIG. 4, the third block B3 has a coating module 23, a rack unit U3, and a transport arm A3. The coating module 23 has the same configuration as the developing modules 22. In the coating module 23, a photoresist liquid as the chemical solution is supplied to the wafer W to form a photoresist film. The rack unit U3 faces the coating module 23 and has thermal treatment modules TM that are heating modules, cooling modules, etc. Pretreatment and posttreatment for photoresist film formation is carried out in the thermal treatment modules TM. In addition, the thermal treatment modules TM each have a transport port 24 for wafers W. The transport arm A3 is disposed between the coating module 23 and the rack unit U3.

The second block B2 and the fourth block B4 each have the same configuration as the third block B3. In the second block B2, a chemical solution for an antireflective film is supplied to the wafer W so as to form a lower antireflective film that serves as a foundation layer for the photoresist film. Similarly in the fourth block B4, the chemical solution for the antireflective film is supplied to the wafer W so as to form an upper antireflective film over the photoresist film. As illustrated in FIG. 3, the transport arm of the second block B2 is indicated by a reference sign A2, and the transport arm of the fourth block B4 is indicated by a reference sign A4.

The interface station S3 is connected to the +Y direction side of the processing station S2. As illustrated in FIG. 1, the interface station S3 includes an interface arm F. The interface arm F is arranged on the +Y direction side of the rack unit U2 of the processing station S2. The interface arm F transports the wafer W among the modules of the rack unit U2 and also between each module of the rack unit U2 and the exposure device S4.

In the coating and developing system 100 that has the aforementioned configuration, a wafer W is transported to each of the modules and subjected to processes corresponding to the modules as follows. First, the wafer W is taken out from a carrier 20 set on the mount table 21 by the transport mechanism C of the carrier station S1 and transported to the receiving/delivering module CPL2 of the rack unit U1 in the processing station S2 (refer to FIG. 3). The wafer W transported to the receiving/delivering module CPL2 is sequentially transported to the modules (thermal treatment modules and coating module) in the second block B2, whereby a lower antireflective film is formed on the wafer W.

The wafer W having the lower antireflective film formed thereon is transported to the receiving/delivering module BF2 of the rack unit U1 by the transport arm A2. Then, the wafer W is transported to the receiving/delivering module CPL3 of the rack unit U1 by the transport mechanism D (illustrated in FIG. 1). Next, the wafer W is received by the transport arm A3 of the third block B3 and sequentially transported to the modules of the third block B3 (thermal treatment modules TM and coating module 23 (illustrated in FIG. 4)) so as to form a photoresist film on the lower antireflective film. The wafer W having the photoresist film formed thereon is transported to the receiving/delivering module BF3 of the rack unit U1 by the transport arm A3.

An upper antireflective film may also be formed over the photoresist film of the wafer W in the fourth block B4. In this case, the wafer W is received by the transport arm A4 of the fourth block B4 via the receiving/delivering module CPL4 and sequentially transported to the modules (thermal treatment module and coating module) of the fourth block B4 to thereby form an upper antireflective film over the photoresist film. After that, the wafer W is delivered to the receiving/delivering module TRS4 of the rack unit U1 by the transport arm A4.

The wafer W having the photoresist film formed thereon (or further having the upper antireflective film thereover) is transported by the transport mechanism D from the receiving/delivering module BF3 (or the receiving/delivering module TRS4) to the receiving/delivering module CPL11. The wafer W transported to the receiving/delivering module CPL11 is then transported to the receiving/delivering module CPL12 of the rack unit U2 by the shuttle arm E. After that, the wafer W is received by the interface arm F of the interface station S3.

The wafer W is next transported to the exposure device S4 by the interface arm F to be subjected to a predetermined exposure process. The wafer W subjected to the predetermined exposure process is transported to the receiving/delivering module TRS6 of the rack unit U2 by the interface arm F and returns to the processing station S2. The wafer W returned to the processing station S2 is transported to the first block B1 to be subjected to a development process. The wafer W subjected to the development process is transported to one of the receiving/delivering modules TRS1 in the rack unit U1 by the transport arm A1 and is returned to a carrier 20 by the transport mechanism C.

Next, the transport arm A3 provided in the third block B3 is described with reference to FIGS. 4 to 6B. As illustrated in FIG. 4, the transport arm A3 has two forks 3A and 3B, a base 31, a rotary mechanism 32, advancing/retracting mechanisms 33A and 33B (illustrated in FIGS. 5, 6A and 6B), and a lift table 34. In addition, the transport arm A3 includes detectors 5A to 5D (described later). The transport arm A3 and the detectors 5A to 5D are controlled by a controller 6 (described later).

Figure 5:
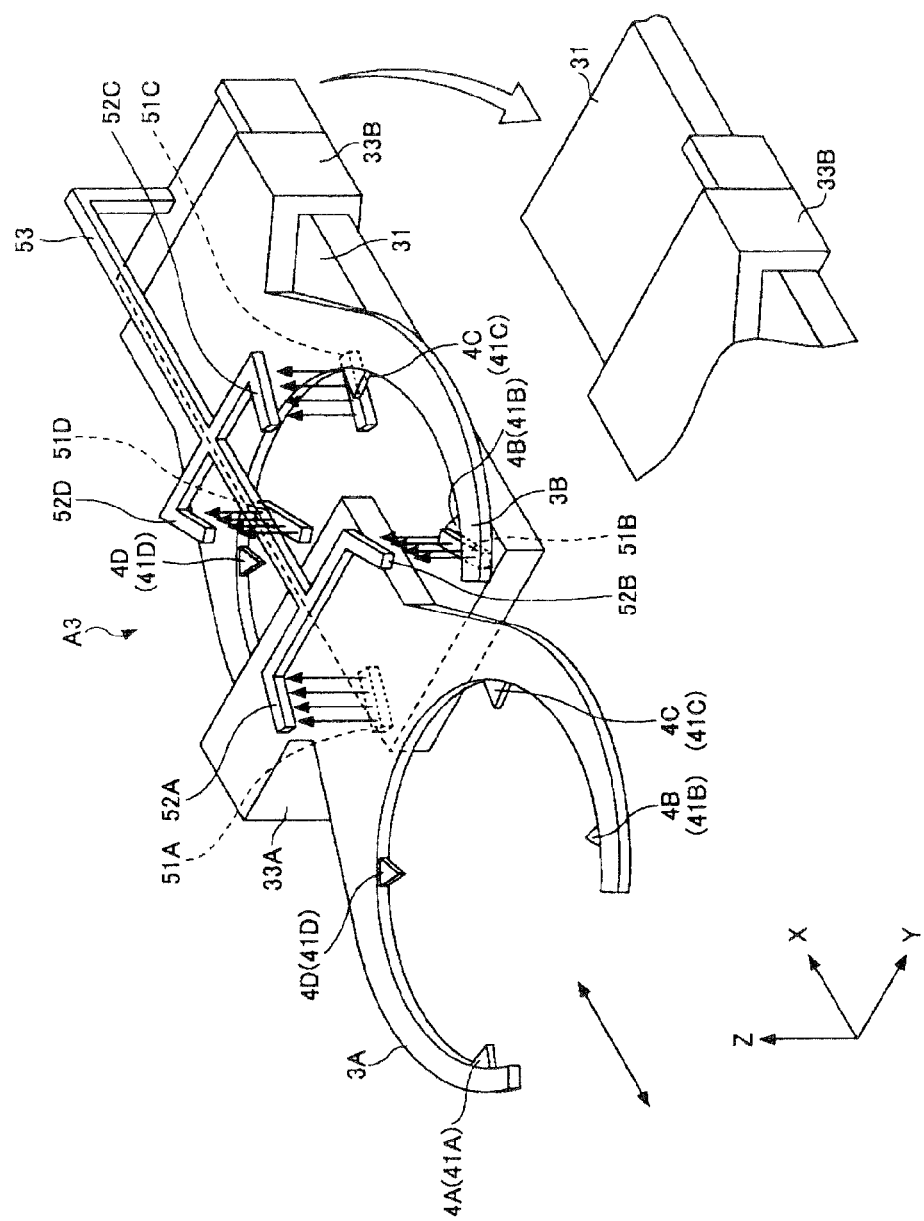
FIG. 5 is a perspective view of a transport arm provided in the photoresist coating and developing system.

The fork 3A is arranged above the fork 3B. The base 31 is rotatable around a vertical axis by the rotary mechanism 32. As illustrated in FIG. 5, the forks 3A and 3B are supported at their base ends by the advancing/retracting mechanisms 33A and 33B. The advancing/retracting mechanisms 33A and 33B are connected to motors M (illustrated in FIG. 9) through a transfer mechanism such as a ball screw mechanism or a timing belt, which drive the forks 3A and 3B to advance and retract relative to the base 31.

Returning to FIG. 4, the lift table 34 is disposed under the rotary mechanism 32. The lift table 34 can be moved up and down by a lifting mechanism along a Z-axis guide rail (not illustrated) extending linearly in the vertical direction (the Z direction in FIG. 4). The lifting mechanism may be a mechanism employing a ball screw mechanism or a timing belt. In this embodiment, the Z-axis guide rail and the lifting mechanism are covered by a cover member 35, and for example, they are connected to the cover member 35 to be integrated therewith at the upper side. The cover member 35 can slide along a Y-axis guide rail 36 extending linearly in the Y direction.

Figure 6:
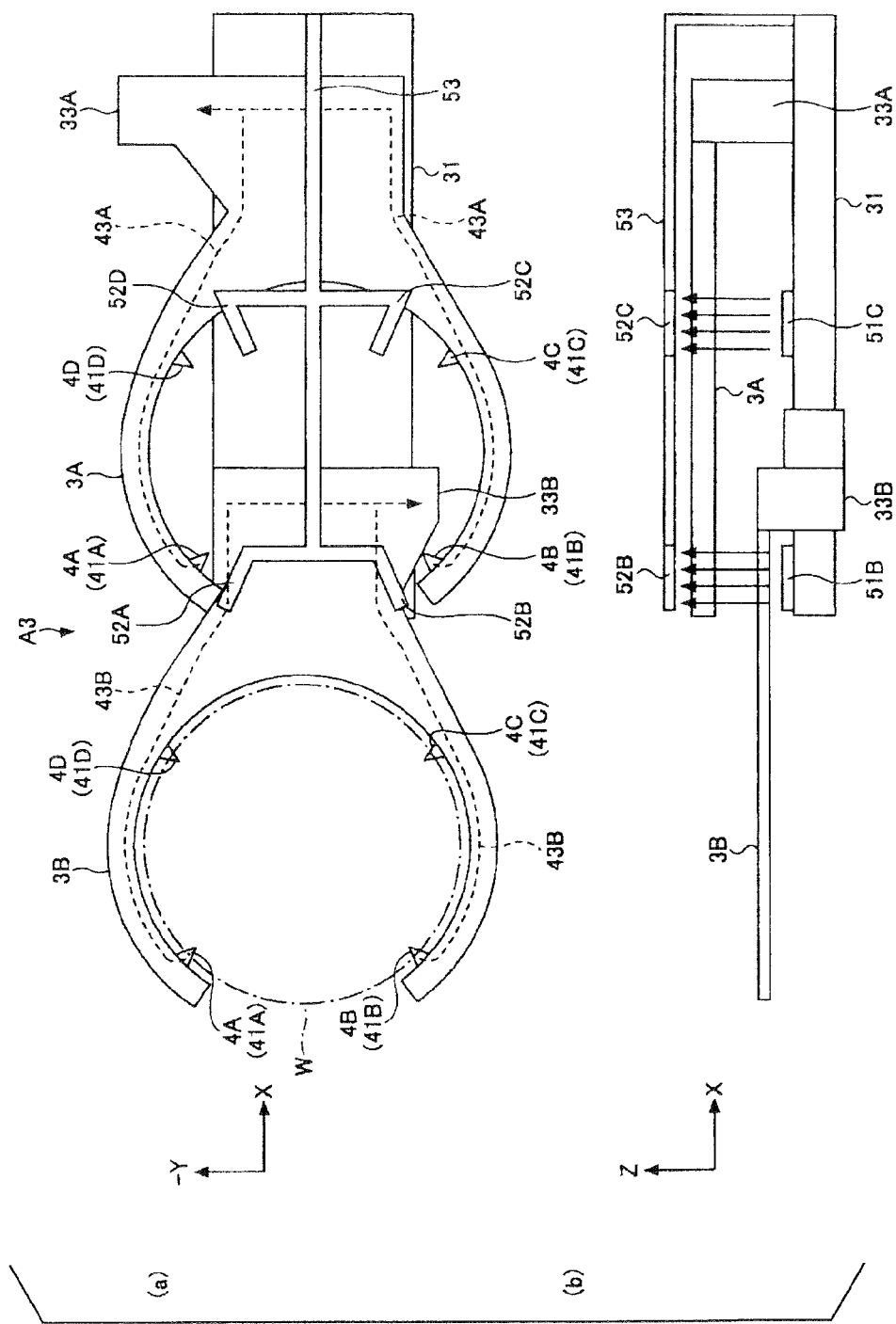
FIG. 6(a) is a plan view of the transport arm.
FIG. 6(b) is a side view of the transport arm.

Next, the forks 3A and 3B are further described with reference to FIGS. 6 and 7. As illustrated in FIG. 6(a), the forks 3A and 3B have an arcuate front end that surrounds the periphery of a wafer W being transported. The forks 3A and 3B each have four holding nails 4A, 4B, 4C and 4D. The holding nails 4A to 4D of each of the forks 3A and 3B project inwardly from the inner circumference of the fork and are arranged along the inner circumference with spaces therebetween. In the example illustrated in FIGS. 5 to 7, four holding nails 4A to 4D are provided: however, the number of nails may be three or more.

Figure 7:
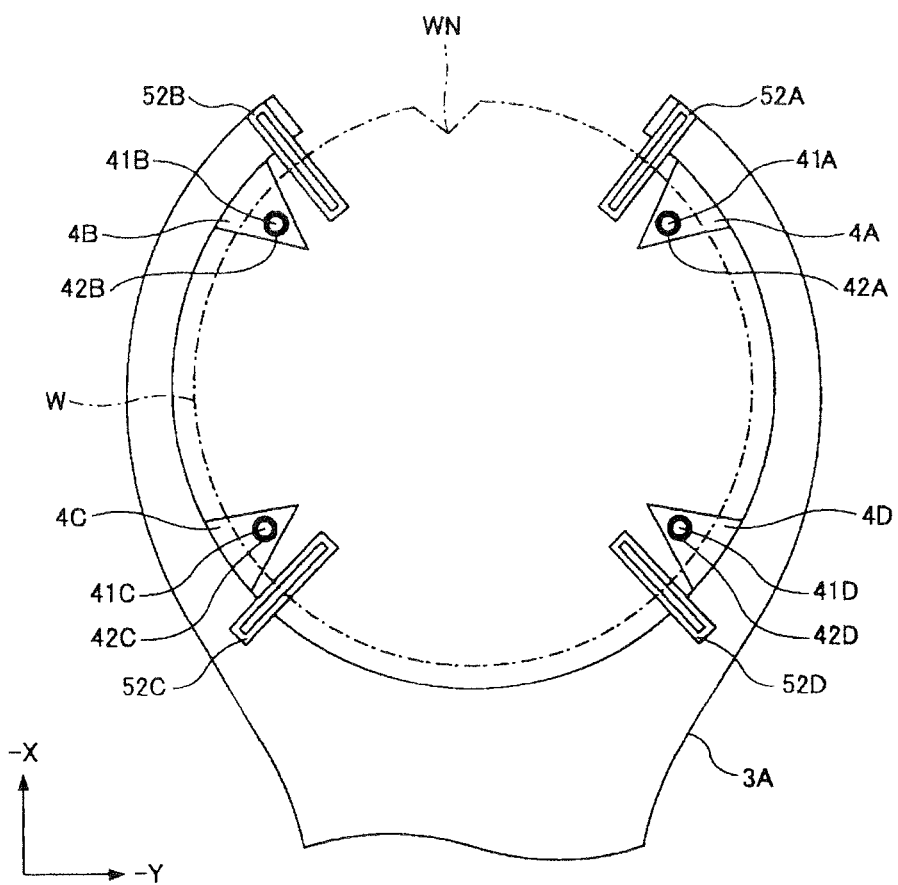
FIG. 7 is an enlarged plan view of a fork of the transport arm.

As illustrated in FIG. 7, the holding nails 4A to 4D of the fork 3A have suction holes 41A to 41D and ring-shaped pads 42A to 42D surrounding the circumference of the suction holes 41A to 41D, respectively. As illustrated in FIG. 6(a), the suction holes 41A to 41D communicate with a vacuum pipe 43A formed inside the fork 3A or on the upper or lower surface of the fork 3A. The vacuum pipe 43A is connected to an evacuation unit (not illustrated). The holding nails 4A to 4D of the fork 3B also have suction holes 41A to 41D and ring-shaped pads 42A to 42D, respectively. As illustrated in FIG. 6(a), the suction holes 41A to 41D communicate with a vacuum pipe 43B formed inside the fork 3B or formed on the upper or lower surface of the fork 3B. The vacuum pipe 43B is connected to the evacuation unit. The vacuum mechanism is configured as described above. When a wafer W is rested on the pads 42A to 42D of the holding nails 4A to 4D, the wafer W drawn by suction by the evacuation unit through the vacuum pipe 43A (or 43B) so that it is firmly held by the fork 3A (or 3B). Preferably, the pads 42A to 42D is made of an elastic material such as rubber in order to increase adhesion between the pads 42A to 42D and the periphery of the back surface of the wafer W.

Next, the detectors for detecting the position of the wafer W held by the fork 3A or 3B are described. Referring to FIG. 5, the base 31 is provided with a supporting member 53 which rises from the base 31 and bends and extends in the horizontal direction. The supporting member 53 has four arms and sensors 52A, 52B, 52C, 52D are respectively attached to the arms. The sensors 52A to 52D are located such that the sensors are above the fork 3A or 3B when the forks are retracted to the base end side. Specifically, as illustrated in FIG. 7A, the sensors 52A to 52D are arranged at predetermined intervals along the periphery of the wafer W held by the fork 3A (or 3B) when viewed from above. In addition, the sensors 52A to 52D extend such that the sensors 52A to 52D cross the periphery of the wafer W. The sensors 52A to 52D in this embodiment are CCD line sensors. The position of the forks 3A and 3B of when the forks 3A and 3B are retracted to the base end side may hereinafter also be referred to as "home position".

Returning to FIG. 5, light sources 51A, 51B, 51C and 51D are disposed on the base 31. The light source 51A corresponds to the sensor 52A. The light source 51B corresponds to the sensor 52B. The light source 51C corresponds to the sensor 52C. The light source 51D corresponds to the sensor 52D. In this embodiment, the light sources 51A to 51D each have a plurality of light emitting diodes (LEDs) arranged linearly.

Alternatively, it may be arranged such that the light sources 51A to 51D are on the supporting member 53 and the sensors 52A to 52D are on the base 31. That is to say, as long as the forks 3A and 3B and the wafers W held by the forks cross the detection sections of the detectors 5A to 5D, the light sources 51A to 51D (or the sensors 52A to 52D) do not need to be arranged on the base 31 but can be arranged on another supporting member.

Figure 8:
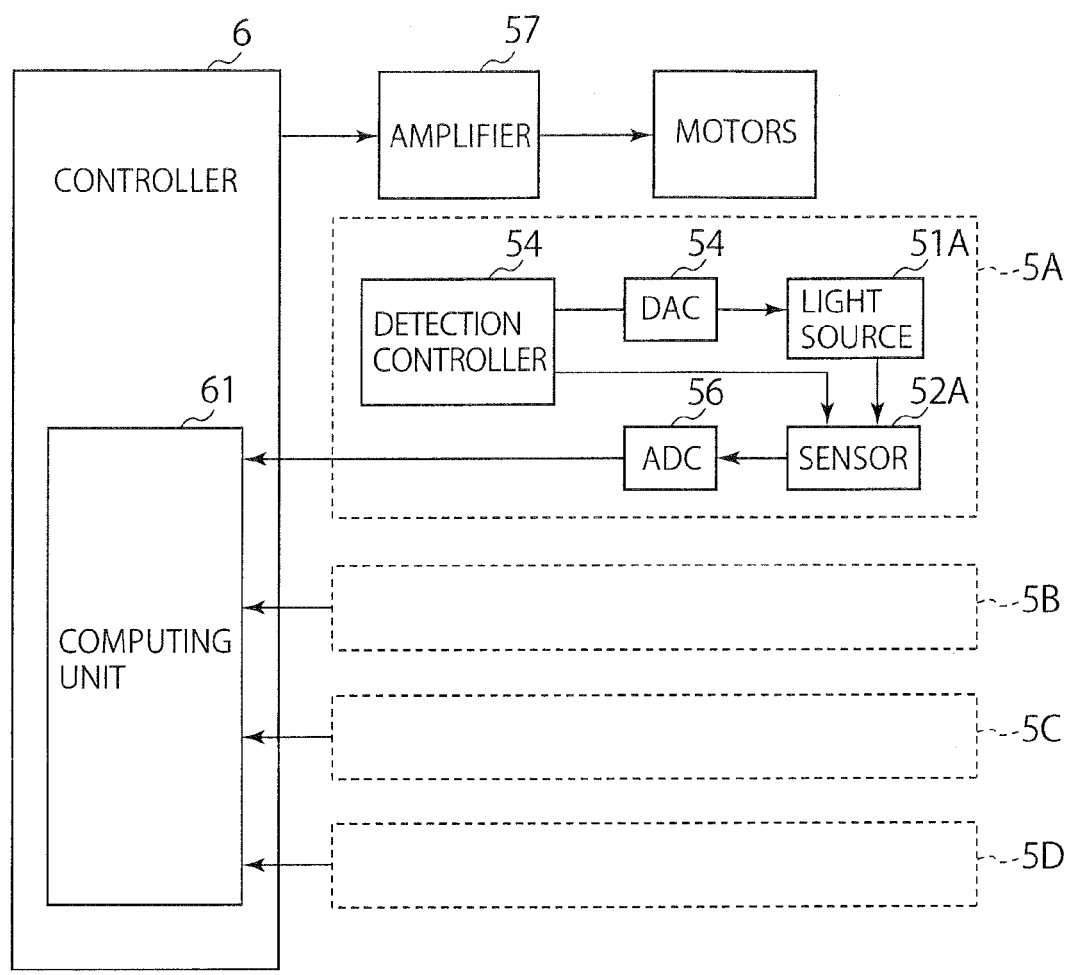
FIG. 8 is a block diagram schematically showing the configuration of a detection unit and a controller associated with the transport arm.

As illustrated in FIG. 8, the detector 5A includes the light source 51A, the sensor 52A, a detection controller 54, a digital-to-analog converter (DAC) 55 and an analog-to-digital converter (ADC) 56. Although not illustrated in FIG. 8, the detectors 5B, 5C, 5D are configured similarly to the detector 5A, each including the corresponding light source 51B, 51C, or 51D and sensor 52B, 52C, or 52D.

The detection controller 54 is a timing generator that shifts operational timing of each of the CCDs of the sensor 52A (CCD line sensor) and transfers charges based on clock signals provided from a clock (not illustrated). In addition, the detection controller 54 controls the current applied to the light source 51A composed of the plurality of LEDs. The DAC 55 converts a digital control signal transmitted from the detection controller 54 into an analog control signal and outputs the converted analog control signal to the light source 51A. The ADC 56 converts an analog detection signal output from the sensor 52A into a digital signal, thereby generating a detection signal.

The detection signal (detection value) output by the ADC 56 of the detector 5A is input to a computing unit 61 in the controller 6. The controller 6 controls, through an amplifier 57, an X-axis drive motor for driving the advancing/retracting mechanisms 33A and 33B, a Y-axis drive motor for driving the base 31, a Z-axis drive motor for driving the lift table 34, and a rotation driving motor for driving the rotary mechanism 32.

In the aforementioned configuration, a digital control signal transmitted from the detection controller 54 is converted into an analog control signal. The light source 51A receives the converted analog control signal and in response emits light linearly. The light emitted by the light source 51A is received by the sensor 52A. On reception of the light, the sensor 52A outputs a detection signal corresponding to the amount of light received according to the timing of a control signal from the detection controller 54. The detection signal (detection value) output from the sensor 52A is converted into a digital signal by the ADC 56 and then input to the computing unit 61 in the controller 6.

Figure 9:
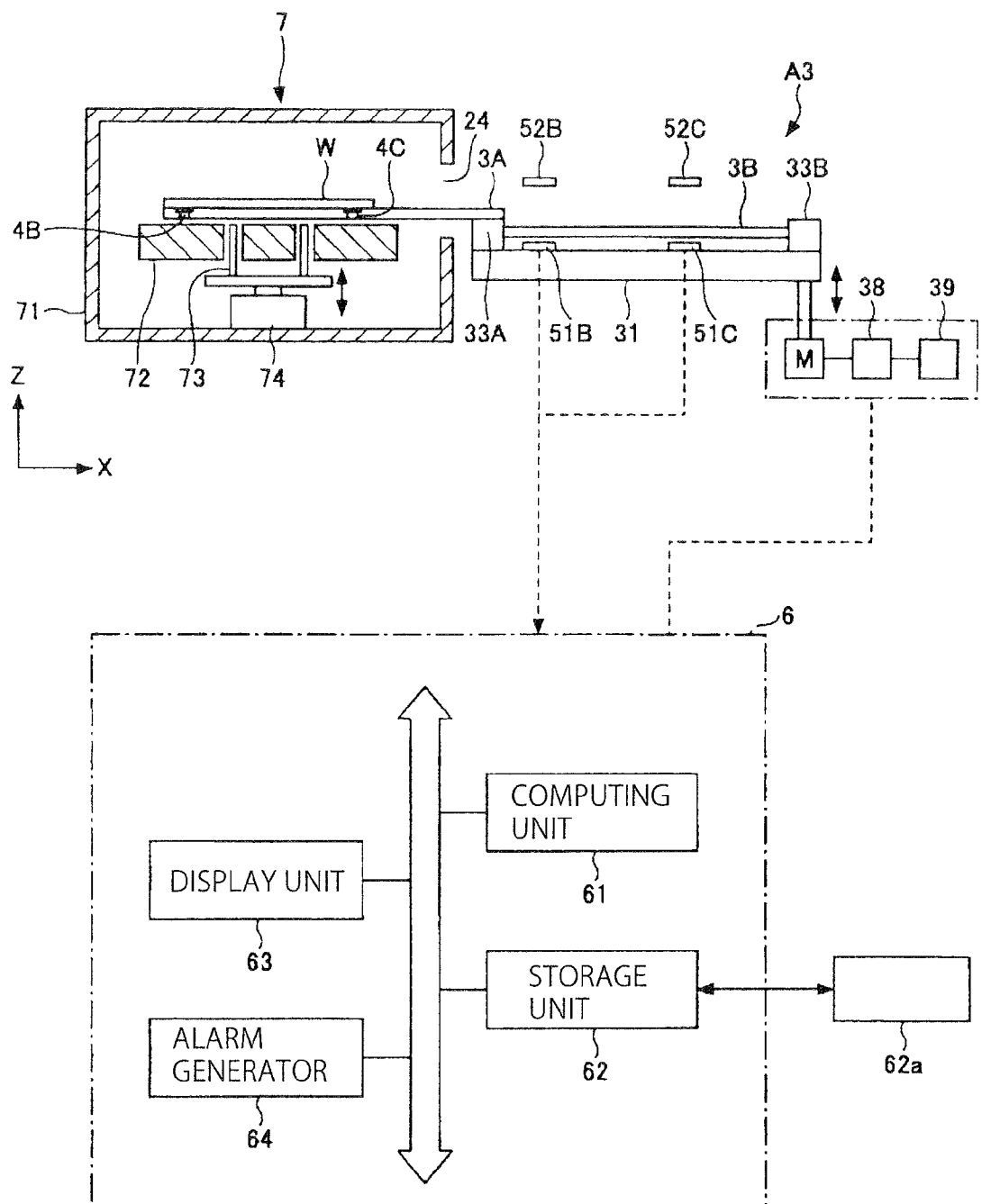
FIG. 9 is a diagram showing a configuration of a controller together with the transport arm and a cooling module in the third block.

The controller 6 controls not only the detectors 5A to 5D but also the operation of the transport arms. The control by the controller 6 for reception and delivery of the wafer W between modules is described with reference to FIG. 9. Referring to FIG. 9, the fork 3A of the transport arm A3 is inserted in a cooling module 7. The cooling module 7 is, for example, one of the thermal treatment modules TM illustrated in FIG. 4. As illustrated in FIG. 9, the cooling module 7 includes a treatment container 71, a placement location 72 (which is a stage on which the wafer is placed), a plurality of lift pins 73, and a lifting mechanism 74. The placement location 72 has a pipe (not illustrated) in which a fluid at an adjusted temperature flows so as to cool the wafer W to a predetermined temperature. In addition, the placement location 72 has a plurality of through holes so that the corresponding plurality of lift pins 73 can be moved up and down by the lifting mechanism 74.

The controller 6 includes the computing unit 61, a storage unit 62, a display unit 63, and an alarm generator 64. The computing unit 61 has, for example, a memory and a central processing unit (CPU). The computing unit 61 reads a program stored in the storage unit 62 and transmits control signals to the motors M of the transport arm A3 in accordance with a command in the program, thereby executing reception/delivery and transfer of wafers W. In addition, the computing unit 61 reads a program stored in the storage unit 62, transmits control signals to each of the parts of the coating and developing system 100 in accordance with a command in the program, thereby executing various processes on the wafers W (substrates).

The storage unit 62 reads and stores programs from a computer-readable storage medium 62a which stores programs for the computing unit 61 to perform the various processes. A flexible disk, a compact disc, a hard disk, a magneto-optical (MO) disc, or the like may be used as the storage medium 62a.

The display unit 63 is a display having a liquid crystal display (LCD) panel or the like. Through this display unit 63, an operator can select programs or input parameters for the various processing on the wafers W (substrates). The alarm generator 64 generates and outputs an alarm signal when abnormality occurs in any of the parts of the coating and developing system 100 including the transport arm A3.

The computing unit 61 transmits control signals to the components such as the advancing/retracting mechanisms 33A and 33B of the transport arm A3, the base 31, the lift table 34, the rotation drive motor in the rotary mechanism 32, an encoder 38, and a counter 39 for counting the number of pulses, and thus controls them. The storage unit 62 stores a program for performing a substrate transport method in this embodiment.

Next, with reference to FIGS. 10 to 13, the substrate transport method in this embodiment is described taking as an example a process where the fork 3A of the transport arm A3 receives a wafer W from one of the modules (hereinafter also referred to as "first module") and transports the wafer W to another module. It is here assumed that the first module is the cooling module 7 (illustrated in FIG. 9) of the third block B3 and the other module is the coating module 23 of the third block B3. In this case, the temperature of the wafer W is adjusted to a predetermined temperature (e.g., 23° C.) in the cooling module 7, and a photoresist film is formed over the wafer W at the adjusted temperature in the coating module 23.

First, in step S11 (illustrated in FIG. 10), the transport arm A3 takes out the wafer W from the cooling module 7. Specifically, as illustrated in FIG. 11(a), the lift pin 73 in the cooling module 7 lifts up the wafer W on the placement location 72 and holds the wafer W above the placement location 72. Next, as illustrated in FIG. 11(b), the fork 3A enters the cooling module 7 through the transport port 24 and is positioned beneath the wafer W. Then, as illustrated in FIG. 11(c), the fork 3A is lifted up and the lift pins 73 are descended. The wafer W is held by the holding nails 4A to 4D of the fork 3A and suctioned by the suction holes 41A to 41D that correspond to the holding nails 4A to 4D.

Next, in step S12 (shown in FIG. 10), it is determined whether or not the wafer W is being suctioned by the fork 3A. The determination is, for example, made by the controller 6 and a vacuum sensor (not illustrated) provided to the vacuum pipe 43A communicating with the suction holes 41A to 41D. When the suction force detected by the vacuum sensor is equal to or higher than a predetermined threshold value (YES in step S12), the controller 6 determines that the wafer W is firmly suctioned. As illustrated in FIG. 11(d), in step S12B, the fork 3A retracts from the cooling module 7 to the home position along the X axis.

When the suction force detected by the vacuum sensor is lower than the predetermined threshold value (NO in step S12), the controller 6 instructs the alarm generator 64 (illustrated in FIG. 9) to transmit an alarm signal. An alert indicating suction failure is displayed on the display unit 63 in accordance with the alarm signal. After the suction failure is solved by the operator of the coating and developing system 100 (step S12A), the fork 3A retracts to the home position as in FIG. 11(d) (step S12B).

In step S13 (illustrated in FIG. 10), while the fork 3A holds the wafer W at the home position, the position of the circumferential edge of the wafer W is measured by the controller 6 and the detector 5A to 5D. Specifically, the light sources 51A to 51D (only the light sources 51B and 51C are illustrated in FIG. 11) disposed beneath the fork 3A emit light upward. The light is received by the sensors 52A to 52D (only the sensors 52B and 52C are illustrated in FIG. 11) located above the fork 3A. When the sensors 52A to 52D are CCD line sensors having CCDs in a row in the radial direction of the wafer W, according to the detected value of each CCD, the boundary between CCDs that received light and those did not can be determined. Then, according to the determined boundary, the position of the circumferential edge of the wafer W can be measured.

Figure 12:
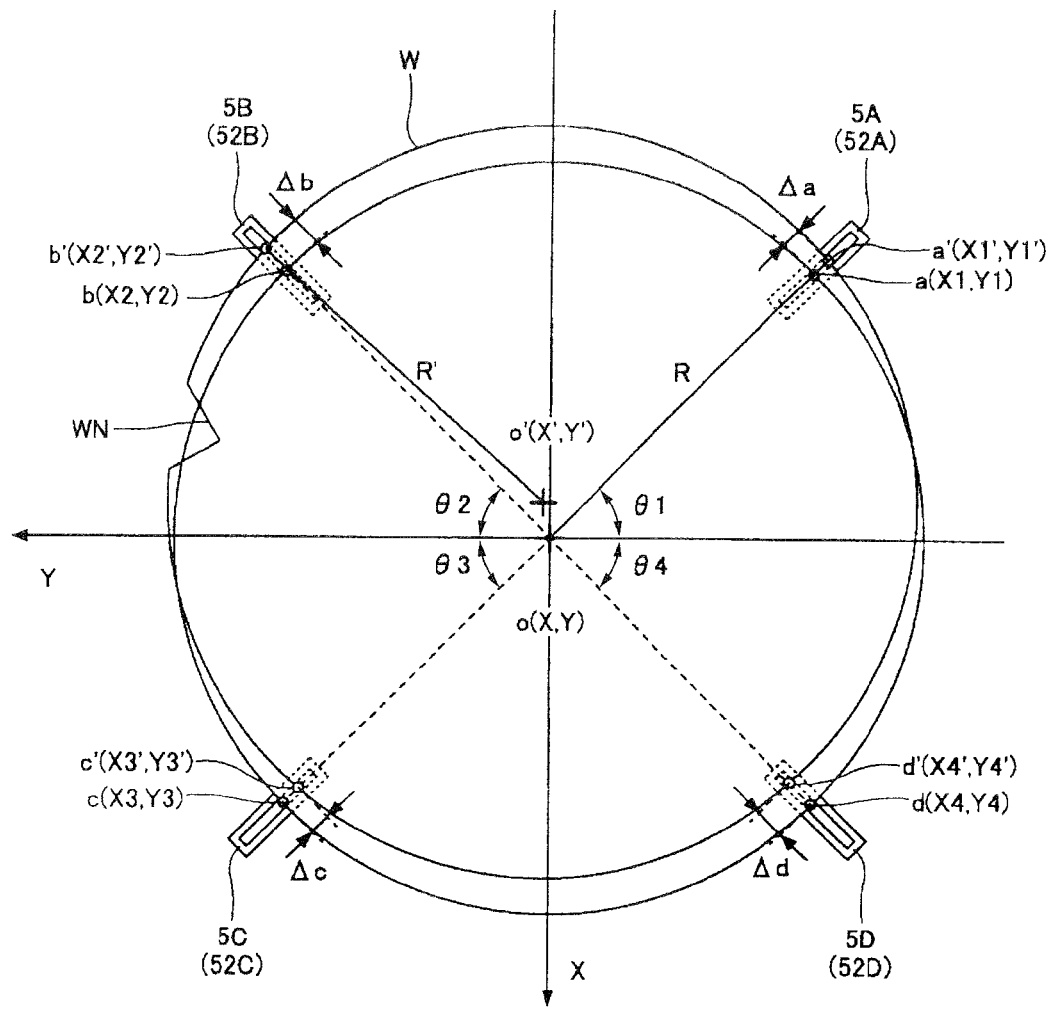
FIG. 12 is a plan view of linear image sensors and a wafer when it is determined that none of the four detectors detect the notch of the wafer.

As illustrated in FIG. 12, angles between the Y axis and the directions in which the four sensors 52A to 52D extend are defined as θ1, θ2, θ3, and θ4. The position of the wafer W held by the fork 3A with no deviation is the reference position. Points on the sensors 52A to 52D that intersect with the circumferential edge of the wafer W at the reference position are defined as points a, b, c and d. On the other hand, the points on the sensors 52A to 52D that cross with the circumferential edge of the wafer W when the wafer W held by the fork 3A has shifted are defined as points a', b', c', and d'.

The distance between the point a and the point a' on the sensor 52A is indicated by Δa. The distance between the point b and the point b' on the sensor 52B is indicated by Δb. The distance between the point c and the point c' on the sensor 52C is indicated by Δc. The distance between the point d and the point d' on the sensor 52D is indicated by Δd. The distances Δa, Δb, Δc, and Δd are represented as follows.

$$\Delta a \text{ (mm)} = \{(\text{number of pixels at point } a') - (\text{number of pixels at point } a)\} \times \text{pixel interval (mm)} \quad (1)$$

$$\Delta b \text{ (mm)} = \{(\text{number of pixels at point } b') - (\text{number of pixels at point } b)\} \times \text{pixel interval (mm)} \quad (2)$$

$$\Delta c \text{ (mm)} = \{(\text{number of pixels at point } c') - (\text{number of pixels at point } c)\} \times \text{pixel interval (mm)} \quad (3)$$

$$\Delta d \text{ (mm)} = \{(\text{number of pixels at point } d') - (\text{number of pixels at point } d)\} \times \text{pixel interval (mm)} \quad (4)$$

"The number of the pixels at the point a (b, c, or d)" means the number of pixels between the start point of the sensor 52A (52B, 52C, or 52D) on the center side of the wafer W and the point a.

Coordinates of the points a to d and a' to d' are represented as follows.

$$\text{Point } a(X1, Y1) = (X - R \sin \theta_1, Y - R \cos \theta_1) \quad (5)$$

$$\text{Point } a'(X1', Y1') = (X1 - \Delta a \sin \theta_1, Y1 - \Delta a \cos \theta_1) = (X - (R + \Delta a)\sin \theta_1, Y - (R + \Delta a)\cos \theta_1) \quad (6)$$

$$\text{Point } b(X2, Y2) = (X - R \sin \theta_2, Y + R \cos \theta_2) \quad (7)$$

$$\text{Point } b'(X2', Y2') = (X2 - \Delta b \sin \theta_2, Y2 + \Delta b \cos \theta_2) = (X - (R + \Delta b)\sin \theta_2, Y + (R + \Delta b)\cos \theta_2) \quad (8)$$

$$\text{Point } c(X3, Y3) = (X + R \sin \theta_3, Y + R \cos \theta_3) \quad (9)$$

$$\text{Point } c'(X3', Y3') = (X3 + \Delta c \sin \theta_3, Y3 + \Delta c \cos \theta_3) = (X + (R + \Delta c)\sin \theta_3, Y + (R + \Delta c)\cos \theta_3) \quad (10)$$

$$\text{Point } d(X4, Y4) = (X + R \sin \theta_4, Y - R \cos \theta_4) \quad (11)$$

$$\text{Point } d'(X4', Y4') = (X4 + \Delta d \sin \theta_4, Y4 - \Delta d \cos \theta_4) = (X + (R + \Delta d)\sin \theta_4, Y - (R + \Delta d)\cos \theta_4) \quad (12)$$

Thus, the coordinates (X1', Y1') of the point a', the coordinates (X2', Y2') of the point b', the coordinates (X3', Y3') of the point c' and the coordinates (X4', Y4') of the point d' can be calculated according to the equations (6), (8), (10), and (12).

The X and Y in the above equations are the X and Y coordinates of the center of the wafer W when the wafer W is located at the reference position. The coordinates (X,Y) of the position o, i.e., the center of the wafer W at the reference position may be beforehand calculated by placing the wafer W at the reference position or calculated according to the inner circumference of the fork 3A.

In step S14 (illustrated in FIG. 10), the coordinates (X', Y') of the position o', i.e., the center of the wafer when the position of the wafer W has shifted are calculated from three of the points a', b', c' and d'. For example, the coordinates (X', Y') of the center position o' of the wafer W at the shifted position are calculated from the coordinates (X1', Y1') of the point a', the coordinates (X2', Y2') of the point b' and the coordinates (X3', Y3') of the point c' according to the following equations (13) and (14).

$$X' = \frac{X1'^2(Y3' - Y2') + X2'^2(Y1' - Y3') + X3'^2(Y2' - Y1') - (Y1' - Y3')(Y3' - Y2')(Y2' - Y1')}{2\{X1'(Y3' - Y2') + X2'(Y1' - Y3') + X3'(Y2' - Y1')\}} \quad (13)$$

$$Y' = \frac{Y1'^2(X2' - X3') + Y2'^2(X3' - X1') + Y3'^2(X1' - X2') - (X2' - X3')(X3' - X1')(X1' - X2')}{2\{Y1'(X2' - X3') + Y2'(X3' - X1') + Y3'(X1' - X2')\}} \quad (14)$$

Further, the radius R' can be calculated from the coordinates (X', Y') of the center position o' of the wafer W, the coordinates (X1', Y1') of the point a', the coordinates (X2', Y2') of the point b' and the coordinates (X3', Y3') of the point c' according to the following equation (15).

$$R' = \sqrt{\{(X' - X1')^2 + (Y' - Y1')^2\}} \quad (15)$$

In step S14, the coordinates (X', Y') of the center position o' of the wafer W and the radius R' are again calculated using equations (13) to (15) based on combinations of three of the points a', b', c', d' other than the aforementioned three points a', b', c': for instance, points a', b', d'; points a', c', d'; and points b', c', d'.

In step S15 (illustrated in FIG. 10), it is determined whether or not any of the four sensors 52A to 52D detects a notch WN at the edge of the wafer W. This determination is performed by using the coordinates (X', Y') of the center position o' of the wafer W and the radius R' calculated in step S14 according to one of the combinations of three of the points a', b', c' and d'. Specifically, it is determined whether or not a radius R' calculated from one combination of three of the points a', b', c', d' is substantially equivalent to the known radius R of the wafer W. As illustrated in FIG. 12, when the notch WN of the wafer W does not exist near any of the points a', b', c', d' in a plan view, the radius R' calculated from any combination of three of the points a', b', c', d' would be substantially equal to the radius R. In this case, it is determined that all the four sensors 52A to 52D did not detect the notch WN of the wafer W.

Figure 13:
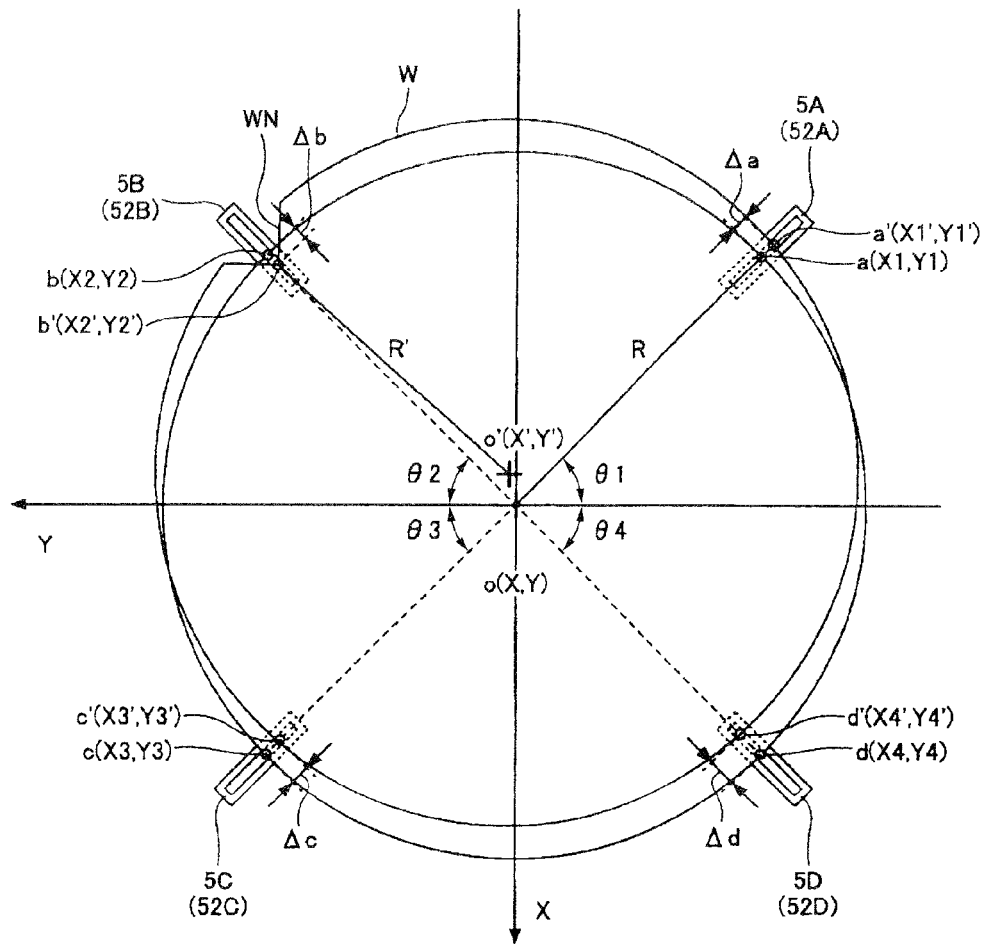
FIG. 13 is a plan view of the linear image sensors and the wafer when it is determined that one of the four detectors detects the notch of the wafer.

On the other hand, as illustrated in FIG. 13, when the notch WN of the wafer W exists near the point b' in a plan view, the radius R' calculated based on the combination of the three points excluding the point b' would be substantially equal to the radius R. However, radiuses R' calculated based on combinations of three points including the point b' would be smaller than the radius R. As a result, it is determined that the sensor 52B of the sensors 52A to 52D detected the notch WN of the wafer W.

In step S16 (illustrated in FIG. 10), of the detection values of the detection sensors 52A to 52D, the values of the three sensors that did not detect the notch WN are selected. When none of the four sensors 52A to 52D detect the notch WN of the wafer W as in FIG. 12, detection values of any three sensors 52 can be selected. In the case illustrated in FIG. 13, detection values of the sensors 52A, 52C and 52D excluding the sensor 52B are selected.

In step S17 (illustrated in FIG. 10), calculation is performed to find the amount of deviation ($\Delta X$, $\Delta Y$) between the coordinates (X', Y') of the center position o' of the wafer W, calculated from detection values of three detectors that did not detect the notch WN, and the coordinates (X, Y) of the center position o of the wafer W at the reference position. The amount of deviation ($\Delta X$, $\Delta Y$) is calculated according to the following equations (16) and (17).

$$\Delta X (mm) = X' - X \quad (16)$$

$$\Delta Y (mm) = Y' - Y \quad (17)$$

In step S18 (illustrated in FIG. 10), the transport arm A3 moves to a standby position for the coating module 23 as illustrated in FIG. 11(e). Specifically, the base 31 is moved with the cover member 35 shown in FIG. 4 along the Y-axis guide rail 36, and then, the rotary mechanism 32 rotates the base 31 approximately 180 degrees, whereby the transport arm A3 is positioned as illustrated in FIG. 11(e).

In step S19 (illustrated in FIG. 10), the position of the wafer W held by the fork 3A is detected at the standby position for the coating module 23. The detection is performed in the same manner as steps S13 to S17. Thus, the amount of deviation ($\Delta X'$, $\Delta Y'$) between the coordinates of the center position o" of the wafer W after transport and the coordinates (X, Y) of the center position o of the wafer W at the reference position is calculated. Since detection values of three detectors same as those selected in step S16 can be used in step S19, the determination for the notch WN of the wafer W (step S15) and the selection of the detection values (step S16) may be omitted in step S19.

Figure 14:
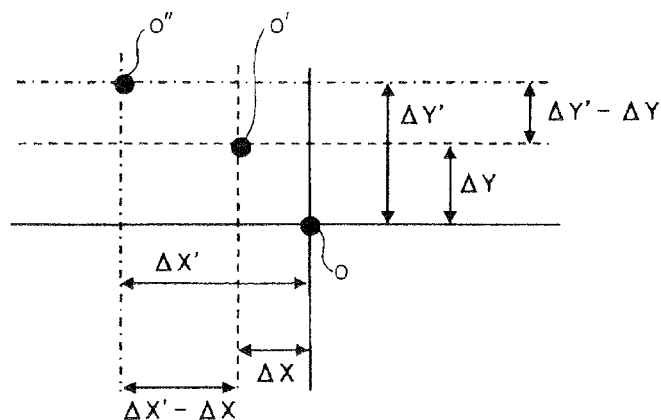
FIG. 14 is a diagram for explaining a difference between positional deviations of the wafer of before and after transport.

In step S20 (illustrated in FIG. 10), the difference D between the deviations of before and after moving the transport arm A3 is calculated. The difference D of the amount of deviations corresponds to the amount of shift of the wafer W caused by the movement of the transport arm A3. Referring to FIG. 14, the difference D can be calculated according to the equation (18) below. In FIG. 14, the reference sign o indicates the center position of the wafer W at the reference position. The reference sign o' indicates the center position of the wafer W before the transport of the wafer W, and the reference sign o" indicates the center position of the wafer W after the transport of the wafer W.

$$D = (|\Delta X' - \Delta X|^2 + |\Delta Y' - \Delta Y|^2)^{1/2} \quad (18)$$

In step S21 (illustrated in FIG. 10), whether or not the difference D between the deviations falls within a predetermined range (in other words, whether or not the difference D defined by the above equation (18) is "equal to or more than" a predetermined threshold value) is determined. The predetermined range may be determined based on the factors such as the size of the wafer W, the size of the fork 3A, and the size of the placement location on which the wafer W is mounted. For example, the predetermined range may be from 100 μm to 300 μm, or may be 100 μm. When it is determined that the difference D between the deviations falls within the predetermined range (YES in step S21), the process proceeds directly to step S23. When the difference D between the deviations exceeds the predetermined range (NO in step S21), an alarm signal is output (step S22). The transportation of the wafer W may continue or be stopped in order to inspect the vacuum mechanism. Whether continue or stop the transport of the wafer W may be determined based on the amount of deviation ($\Delta X'$, $\Delta Y'$) described later. That is, when the difference D between the deviations exceeds the predetermined range (NO in step S21) while the amount of deviation ($\Delta X'$, $\Delta Y'$) is in a predetermined range, it may be determined to continuously transport the wafer W.

Figure 10:
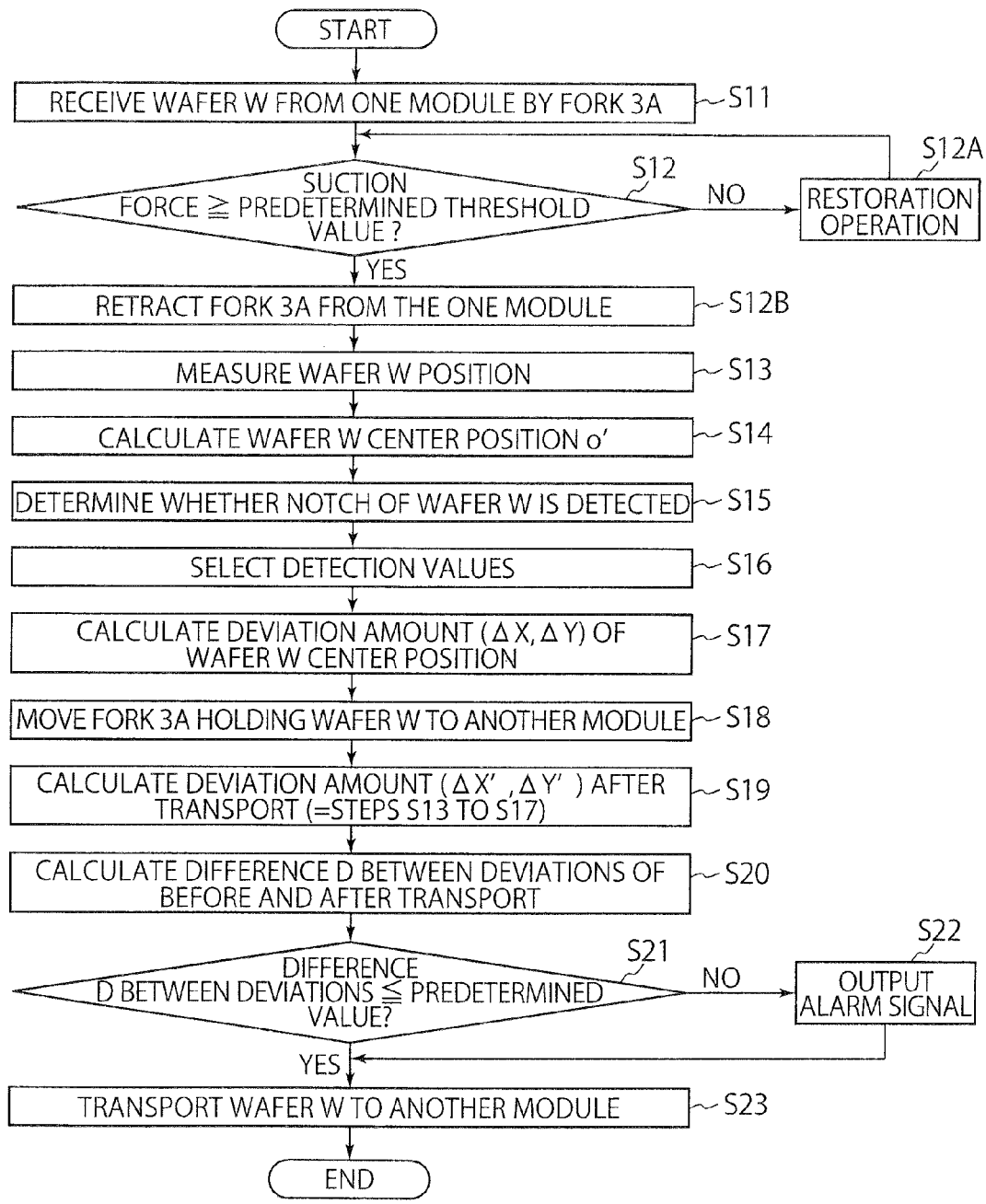
FIG. 10 is a flowchart for explaining a substrate transporting method in one embodiment.
Figure 11:
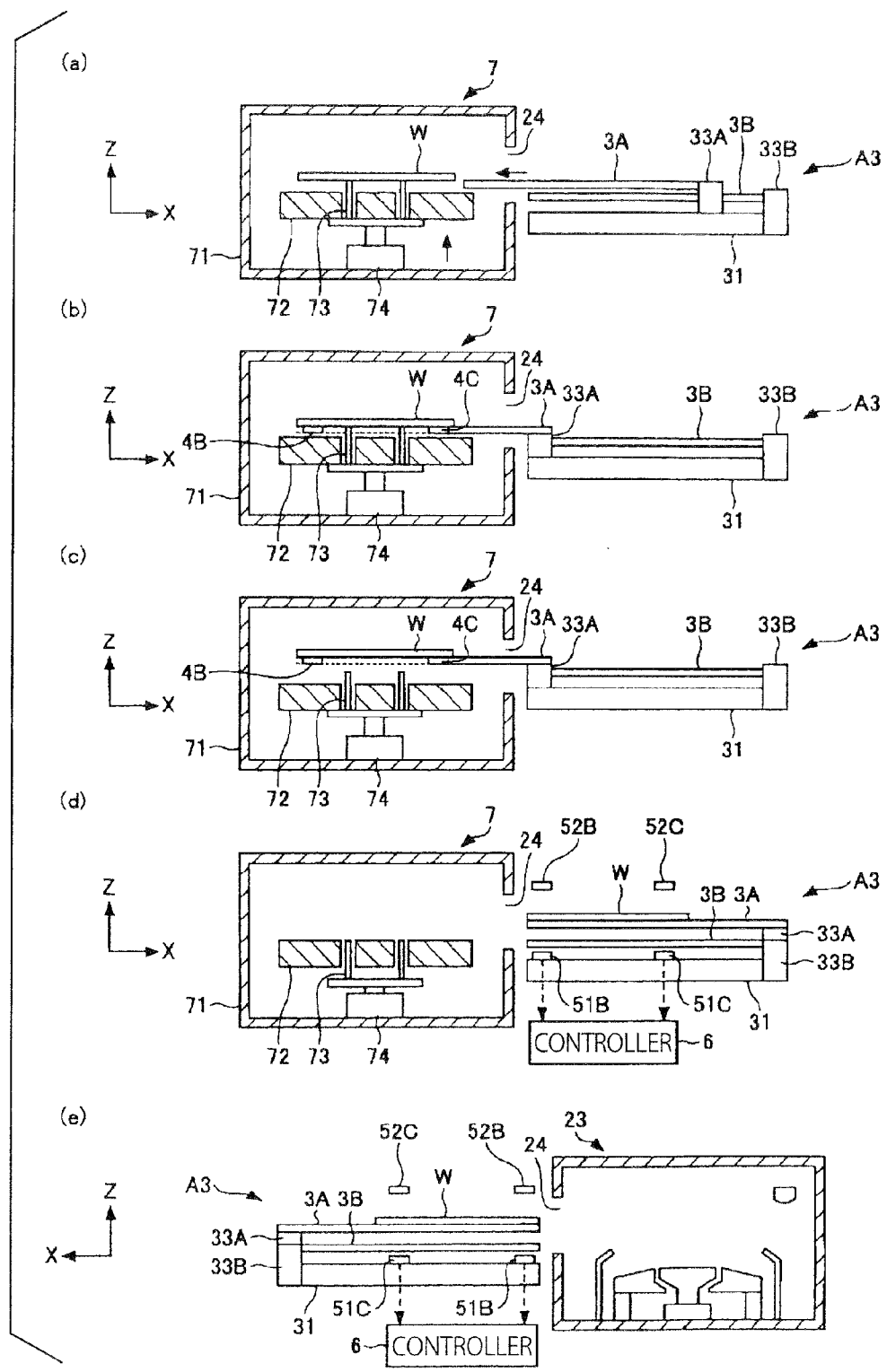
FIG. 11 shows explanatory diagrams for explaining a substrate transporting method in the one embodiment.

The process next proceeds to step S23 (illustrated in FIG. 10). In step S23, while the fork 3A transports the wafer W into the coating module 23, the fork 3A corrects the deviation ($\Delta X'$, $\Delta Y'$), that is, the deviation of the wafer W with respect to the fork 3A calculated at the standby position for the coating module 23. The fork 3A then delivers the wafer W to a spin chuck S in the coating module 23.

In the substrate transport method in this embodiment, calculation for finding the deviation (($\Delta X$, $\Delta Y$) and ($\Delta X'$, $\Delta Y'$)) of the coordinates between the standard center position and the actual center position of the wafer W are performed before and after the transport of the wafer W from the first module (cooling module 7) to the other module (coating module 23) by the transport arm A3. Thus, the positional displacement of wafer W caused during the transport of the wafer W, i.e., the difference D of the deviations can be calculated. This makes it possible to understand that displacement of the wafer W with respect to the fork 3A has occurred during the transport of the wafer W. Possible causes of such shift are a failure in the vacuum mechanism, abrasion of the pads 42A to 42D, warpage of the wafer W, leakage from the vacuum pipe 43A (illustrated in FIG. 6), a reduction in the suction force caused by a failure in the evacuation unit, etc. The substrate transport method in this embodiment however enables detection of such failures.

In addition, the wafer W is transported into the other module (coating module 23) while the amount of deviation ($\Delta X'$, $\Delta Y'$) calculated at the standby position for the other module is corrected. Thus, the wafer W can be placed more appropriately on the placement location of the other module.

In semiconductor manufacturing devices such as the coating and developing system 100, the transport speed of wafers is tending to be increased in order to improve the throughput. Thus, positional displacement (shift) of wafers is more likely to occur during their transportation. With the substrate transport method and the substrate transport apparatus (transport arm) in this embodiment, positional displacement of a wafer during its transport can be detected. Therefore, for example, abrasion of the pads can be detected, whereby occurrence of a defective wafer caused by positional deviation of the wafer can be suppressed.

In a substrate transport method in another embodiment, the predetermined range referred to upon determination on the difference D between the deviations may be set in view of uniformity of the process performed in the other module into which the wafer W is to be transported. For example, a case is considered where a wafer W can be appropriately placed on the placement location in the other module even when the difference D between the deviations is approximately 300 μm (the difference D falls within the predetermined range). However, if it is assumed that the uniformity can be improved when the difference D between the deviations is smaller than 100 μm, it is preferable to set the reference for determination on the difference D at a range of 100 μm smaller than the above-described predetermined range (the smaller range is hereinafter referred to as "acceptable range" for convenience sake). In this case, even when the difference D between the deviations exceeds 100 μm, the difference D may be displayed on the display unit 63 and if it is confirmed not to exceed 300 μm, the wafer W may be transported into the other module and processed therein. Such system enables signs of a failure to be recognized.

In another embodiment, the predetermined range may be divided in two phases, and alerts corresponding to the two predetermined phases may be issued. In the aforementioned example, it is preferable that the first predetermined phase is set to 100 μm and the second predetermined phase is set to 300 μm. With the ranges set as such, when the difference D exceeds the first predetermined range, the process may automatically continue although a warning is issued. When the difference D exceeds the second predetermined range, an alert may be issued and/or the substrate processing system may be stopped.

Figure 15:
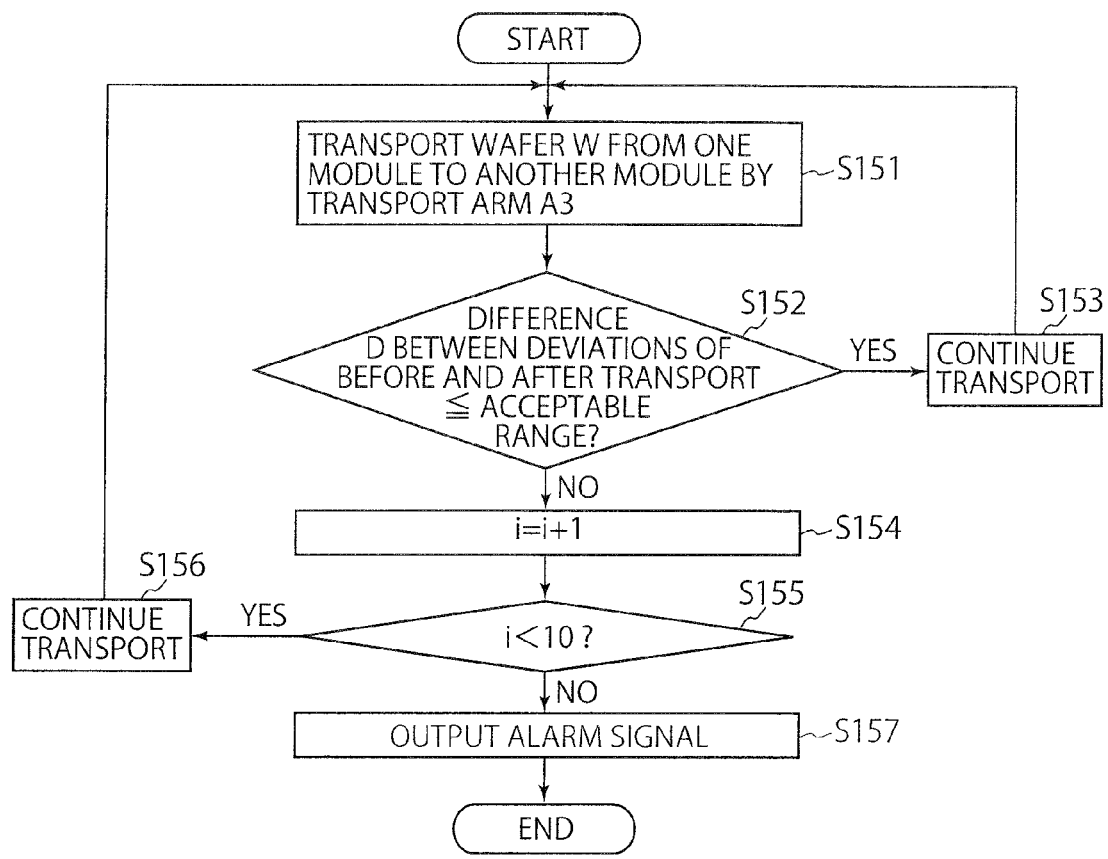
FIG. 15 is a flowchart for explaining a substrate transporting method in another embodiment.

In another embodiment, when the difference D between the deviations is determined based on an acceptable range (or when two predetermined ranges are set), it is preferable to count and store the number of times of exceedance of the acceptable range (or the second predetermined range). Details of this process are as follows. As illustrated in FIG. 15, in step S151, the wafer W is transported from the first module to the other module (the standby position for the other module) in accordance with the aforementioned steps S11, S128, S18 and S23. In step S152, the difference D between the deviations are calculated, and the controller 6 determines whether or not the difference D between the deviations falls within the acceptable range in accordance with the aforementioned steps S13 to S21. When it is determined to fall within the acceptable range (YES in step S152), the wafer W is transported to the other module (step S153), and transportation of another wafer W is performed (step S151).

When it is determined to be outside the acceptable range (NO in step S152), for example, 1 is added to a flag i stored in the storage unit 62 and the value after adding 1 is stored in the storage unit 62 (step S154). Then, the flag i stored in the storage unit 62 is referred to so as to determine, for example, whether the flag i is smaller than 10 (step S155). When it is determined that the flag i is smaller than 10 (YES in step S155), the wafer W is transported into the other module (step S156). On the other hand, when the flag i is equal to or larger than 10 (NO in step S155), an alarm signal is output (step S157). In response to the alarm signal, an alert is displayed on the display unit 63 and/or the device is stopped. Thus, an alarm signal is output when the count of the times where the difference D between the deviations of before and after the transport exceeds the acceptable range reaches 10. The degree of failure such as abrasion of the pads 42A to 42D of the fork 3A can therefore be recognized while continuing operation of the device. This is advantageous in that the schedule of maintenance can be determined based on a quantitative judgment standard. The criterion count for determining outputting of an alarm signal, that is, the criterion for the number of times the difference D between the deviations has exceeded the acceptable range, is not limited to 10 and may be set at another appropriate value.

When it is determined that the difference D between the deviations exceeds the predetermined range (NO in step S21), the deviation of the wafer W may be corrected according to the amount of deviation (ΔX', ΔY') of the wafer W after transport which has been calculated in step S19 (shown in FIG. 10). Specifically, as illustrated in FIGS. 4 to 6B, the fork 3A is moved by the advancing/retracting mechanism 33A over a distance corresponding to ΔX', and the cover member 35 is driven so that the fork 3A moves a distance corresponding to ΔY'. Thus, the center position of the wafer W can be corrected, whereby the wafer W is appropriately placed on the placement location of the other module. Instead of correcting the center position of the wafer W in the X and Y directions, the center position of the wafer W may be corrected in the X or Y direction while rotating the fork 3A by the rotary mechanism 32.

When the difference D between the deviations exceeds the predetermined range (NO in step S21 in FIG. 10), or when the number of times where the difference D between the deviations of the wafer W of before and after the transport has exceeded the acceptable range is equal to or more than the predetermined number (NO in step S155), the controller 6 may control the fork 3A to reduce the transport speed of the wafer W transport. This may achieved by outputting from the controller 6 (shown in FIG. 9) instruction signals to reduce the transport speed to the motors, the encoder 38, the counter 39 for counting the number of pulses, etc. When the fork 3A transports the wafer W at the reduced speed and the result of the determination is still negative, the transport speed may be further reduced. With such system, replacement of the pads 42A to 42D can be delayed, and a schedule for maintenance of the device can be flexibly set.

When the difference D between the deviations exceeds the predetermined range (NO in step S21 in FIG. 10), or when the number of times where the difference D between the deviations of the wafer W of before and after the transport of the wafer W has exceeded the acceptable range exceeds the predetermined range (NO in step S155), the acceleration of the fork 3A during the transport of the wafer W by the fork 3A may be reduced. The acceleration of the fork 3A can be reduced by outputting from the controller 6 (shown in FIG. 6) instruction signals to reduce the acceleration of the fork 3A to elements such as the motors, the encoder 38, the counter 39 for counting the number of pulses. The position of the wafer W is highly likely to shift upon start and stop of the transport by the fork 3A. Therefore, if the acceleration of the fork 3A upon start and stop of transport is decreased, the positional deviation (difference D between the deviations) of the wafer W between before and after the transport can be reduced.

The aforementioned embodiments can be modified as below.

For example, in step S23, the deviation (ΔX', ΔY') is corrected while the wafer W is transported into the coating module 23 in the above embodiments. However, the wafer W may be transported into the coating module 23 after correcting the deviation (ΔX', ΔY') at the standby position for the coating module 23.

The difference D between the deviations of before and after the movement of the fork 3A is calculated after moving the fork 3A from the cooling module 7 to the standby position for the coating module 23 in the above embodiments. Instead, the deviation of the wafer W with respect to the fork 3A caused by the movement of the fork 3A may be detected while the fork 3A is moving. In this case, the deviation can be detected by performing steps S13 to S17 (described with reference to FIG. 10) and comparing the deviation with the amount of deviation (ΔX, ΔY) while the fork 3A is moving. Then, during the movement of the fork 3A, it is determined whether or not the positional deviation of the wafer W calculated during the movement of the fork 3A is in a predetermined range. When it is determined that the deviation does not fall within the predetermined range, the movement of the fork 3A may be stopped. Alternatively, when it is determined not to fall within the predetermined range, an alarm may be output after the fork 3A has reached the standby position for the coating module 23. In addition, after step S17, there may be a step for determining whether the deviation (ΔX, ΔY) calculated in step S17, that is, the deviation (ΔX, ΔY) of the wafer W with respect to the fork 3A after the wafer W is taken out from the cooling module 7 is in the predetermined range.

Before step S21 (illustrated in FIG. 10) in which whether the difference D between the deviations falls within a predetermined range is determined, there may be a step for determining whether the wafer W can be transported into the coating module 23 based on the deviation (ΔX', ΔY'). Specifically, it may be determined whether or not the deviation (ΔX', ΔY') falls within a range such that the wafer W can be transported into the coating module 23 without contacting the transport port 24 of the coating module 23. When it is determined that the transport is possible, the wafer W may be transported into the coating module 23 regardless of the result of the determination in the subsequent step S21, i.e., whether or not the difference D between the deviations is in the predetermined range. After the transportation, the vacuum mechanism of the fork 3A may be inspected. Meanwhile when it is determined that the transportation into the coating module 23 is impossible, an alarm may be output to stop the coating and developing system 100.

In the aforementioned embodiments, the transport arm A3 is described as an example. However, the transport arms A2 and A4, the transport mechanism C, the transport mechanism D, and the interface arm F may also have the same configuration as the transport arm A3, so that those components as well carry out the above-described substrate transport method. The module from which the wafer W is transported (the first module) and the module to which the wafer W is transported (the other module) are not limited to the exemplified modules: they may be modules that have a placement location on which a wafer W is to be placed. In addition, a substrate transport method corresponding to the aforementioned embodiments can be applied to when one arm receives a wafer W from another arm to transport the wafer W to a module. In this case, the arm receiving the wafer W corresponds to the placement location.

The aforementioned embodiments are not limited to the configuration in which two forks 3A and 3B are disposed above and below such that they vertically overlap with each other. The two forks 3A and 3B may be arranged side by side in the horizontal direction. Further, there may be only one fork or three or more forks, and the forks may be arranged to overlap in the vertical direction or side by side in the horizontal direction.

In the aforementioned embodiments, four light sources 51A to 51D and corresponding four sensors 52A to 52D are arranged on each of the forks 3A and 3B in consideration of a notch WN of the wafer W. When, for example, a wafer that does not have a notch WN and has an orientation flat (OF) is to be used, and the position of the OF is assumed not to largely shift, three light sources and corresponding three sensors may be arranged to detect circumferential portions of a wafer W other than the OF.

Instead of the light sources 51A to 51D and the corresponding sensors 52A to 52D, electrostatic sensors may be provided to the holding nails 4A to 4D to detect the position of the wafer W relative to the fork 3A, etc. Another alternative is to use a camera. Based on images acquired by the camera, the position of the wafer W relative to the fork 3A, etc. can be detected. When a camera is employed, it suffices as long as positional information of four points of the circumferential edge of the wafer W can be obtained, and it is unnecessarily to use four cameras. For instance, one camera may obtain positional information of four points of the circumferential edge of the wafer W. When only one camera is to be used, the camera may be attached to the base 31 via the support member so that the camera is located above the two forks 3A and 3B.

In the case where a camera(s) is used, as described in the examples employing sensors 52A to 52D, the camera acquires an image when the forks 3A and 3B holding wafers W are at their home positions. The positional information of the four points of the circumferential edge of the wafer W is calculated by processing the acquired image. Then, it is determined whether or not the notch WN of the wafer W has been detected at any one of the four points of the circumferential edge of the wafer W. When it is determined that the notch WN of the wafer W is detected at one of the four points of the circumferential edge of the wafer W, the position of the wafer W relative to the fork 3A, etc. can be detected based on positional information of the three points excluding that point.

Cases where a plurality of LEDs are used as the light sources 51 are described above as an example. Alternatively, the light source may be a single LED with a light guiding member extending linearly on its light emitting side, thus forming a linear light source. Various linear image sensors such as fiber line sensors or photoelectric sensors may be used as the sensors 52 instead of CCD line sensors.

The position of the wafer W relative to the fork 3A was calculated based on the center position o of the wafer W at the reference position in the aforementioned embodiments. One or more positional marks may instead be set on the fork 3A as a reference, and the positional deviation of the wafer W with respect to the fork 3A may be detected based on the positional marks.

The substrates to be transported are not limited to semiconductor wafers W. The transported substrates may as well be glass substrates for a flat panel display (FPD).

The invention claimed is:

1. A substrate transport method that is performed in a substrate processing system, the substrate processing system including a substrate transport apparatus, which has a holding unit configured to hold the substrate by vacuum suction and which is configured to transport the substrate held by the holding unit, the substrate processing system further including a plurality of placement locations each allowing the substrate transported by the substrate transport apparatus to be placed thereon, said method comprising:

receiving the substrate placed on one of the plurality of placement locations by the holding unit and holding the substrate by vacuum suction;

retracting the holding unit from the one placement location with the holding unit holding the substrate;

detecting a first positional deviation of the substrate held by the holding unit from a reference position of the substrate on the holding unit;

transporting the substrate held by the holding unit to a position facing another placement location;

detecting a second positional deviation of the substrate held by the holding unit from the reference position of the substrate on the holding unit, when the substrate is located at the position facing said another placement location;

calculating, based on the first and second positional deviations, a positional displacement of the substrate relative to the holding unit that occurred during the transporting of the substrate to the position facing the another placement location; and determining whether or not the positional displacement thus calculated falls within a predetermined range.

2. The substrate transport method according to claim 1, further comprising:

issuing an alert indicating a result of the determining if it is determined that the positional displacement is not in the predetermined range.

3. The substrate transport method according to claim 1, further comprising:

counting number of times the positional displacement has been determined not to be in the predetermined range;

determining whether or not the counting exceeds a predetermined number; and outputting an alarm signal indicating that the counting exceeds the predetermined number if it is determined that the counting exceeds the predetermined number.

4. The substrate transport method according to claim 1, further comprising:

counting number of times the positional displacement has been determined not to be in the predetermined range;

determining whether or not the counting exceeds a predetermined number; and outputting an instruction signal that reduces moving speed of the holding unit if it is determined that the counting exceeds the predetermined number.

5. The substrate transport method according to claim 1, further comprising:

counting number of times the positional displacement has been determined not to be in the predetermined range;

determining whether or not the counting exceeds a predetermined number; and outputting an instruction signal that reduces acceleration of the holding unit when movement thereof starts and/or stops, if it is determined that the counting exceeds the predetermined number.

6. The substrate transport method according to claim 1, further comprising:

correcting the positional displacement if the positional displacement is not in the predetermined range.

7. A substrate transport apparatus that transports a substrate between a plurality of placement locations each allowing the substrate to be placed thereon, said substrate transport apparatus comprising:

a holding unit that holds a substrate by vacuum suction;

a detector that detects a positional deviation of the substrate held by the holding unit from a reference position of the substrate on the holding unit; and a controller that calculates a positional displacement of the substrate relative to the holding unit that has occurred during transportation, and determines whether or not positional displacement is in a predetermined range, wherein the controller is configured to calculate the positional displacement based on a first positional deviation of the substrate detected by the detector after the holding unit has held the substrate received from one of the plurality of placement locations, and a second positional deviation of the substrate detected by the detector at a position facing another placement location after the holding unit has been moved to the position facing said another placement location.

8. The substrate transport apparatus according to claim 7, wherein the controller is configured to issue an alert indicating a result of the determination if the positional displacement is not in the predetermined range.

9. The substrate transport apparatus according to claim 7, wherein the controller is configured to count number of times the positional displacement has been determined not to be in the predetermined range, configured to determine whether or not the counting exceeds a predetermined number; and configured to output an alarm signal indicating that the counting exceeds the predetermined number if it is determined that the counting exceeds the predetermined number.

10. The substrate transport apparatus according to claim 7, wherein the controller is configured to count number of times the positional displacement has been determined not to be in the predetermined range, configured to determine whether or not the counting exceeds a predetermined number, and configured to output an instruction signal that reduces transport speed of the substrate transport apparatus if it is determined that the counting exceeds the predetermined number.

11. The substrate transport apparatus according to claim 7, wherein the controller is configured to count number of times the positional displacement has been determined not to be in the predetermined range, configured to determine whether or not the counting exceeds a predetermined number, and configured to output an instruction signal that reduces acceleration of the holding unit when movement thereof starts and/or stops, if it is determined that the counting exceeds the predetermined number.

12. The substrate transport apparatus according to claim 7, wherein the controller is configured to corrects the positional displacement if it is determined that the positional displacement is not in the predetermined range.

13. A coating and developing system comprising:

the substrate transport apparatus according to claim 7;

a coating device that receives a substrate transported by the substrate transport apparatus, and applies a photoresist film onto the substrate; and a developing device that receives the substrate, transported by the substrate transport apparatus and having thereon the photoresist film having been exposed, and develops the photoresist film.

* * * * *